United States Patent
Harvill

(10) Patent No.: US 11,830,051 B2
(45) Date of Patent: Nov. 28, 2023

(54) SYSTEM AND METHOD FOR HIGH QUALITY RENDERINGS OF SYNTHETIC VIEWS OF CUSTOM PRODUCTS

(71) Applicant: Zazzle Inc., Redwood City, CA (US)

(72) Inventor: Young Leslie Harvill, El Granada, CA (US)

(73) Assignee: ZAZZLE INC., Menlo Park, CA (US)

( * ) Notice: Subject to any disclaimer, the term of this patent is extended or adjusted under 35 U.S.C. 154(b) by 37 days.

(21) Appl. No.: 17/501,513

(22) Filed: Oct. 14, 2021

(65) Prior Publication Data

US 2022/0129964 A1   Apr. 28, 2022

Related U.S. Application Data

(60) Provisional application No. 63/104,362, filed on Oct. 22, 2020.

(51) Int. Cl.

| | |
|---|---|
| G06Q 30/0601 | (2023.01) |
| G06T 11/00 | (2006.01) |
| G06T 19/20 | (2011.01) |
| G06F 30/12 | (2020.01) |
| G06T 15/04 | (2011.01) |

(52) U.S. Cl.
CPC ......... *G06Q 30/0621* (2013.01); *G06F 30/12* (2020.01); *G06Q 30/0627* (2013.01); *G06Q 30/0643* (2013.01); *G06T 11/001* (2013.01); *G06T 19/20* (2013.01); *G06T 15/04* (2013.01); *G06T 2200/24* (2013.01); *G06T 2210/16* (2013.01); *G06T 2219/2012* (2013.01); *G06T 2219/2021* (2013.01)

(58) Field of Classification Search
CPC .......... G06Q 30/0621; G06Q 30/0627; G06Q 30/0643; G06F 30/12; G06T 11/001; G06T 19/20; G06T 2219/2012; G06T 2200/24; G06T 2210/16; G06T 2219/2021; G06T 15/04

See application file for complete search history.

(56) References Cited

U.S. PATENT DOCUMENTS

| | | | | |
|---|---|---|---|---|
| 5,999,189 | A * | 12/1999 | Kajiya | G06T 15/60 382/232 |
| 6,363,404 | B1 * | 3/2002 | Dalal | G06F 16/9577 715/848 |
| 6,614,444 | B1 * | 9/2003 | Duluk, Jr. | G06T 15/04 345/592 |
| 6,717,576 | B1 * | 4/2004 | Duluk, Jr. | G06T 11/40 345/506 |

(Continued)

*Primary Examiner* — YuJang Tswei
(74) *Attorney, Agent, or Firm* — Patterson & Sheridan LLP

(57) ABSTRACT

In some embodiments, a data processing method for generating a synthetic view rendering of a custom product, the method comprises: generating a calibrated product renderings asset of a referenced physical product by: based on user input received for a digital asset corresponding to the referenced physical product, generating user-driven settings for a plurality of product option parametric key-values, applying the plurality of product option parametric key-values to the digital asset to generate the calibrated product rendering asset; rendering the calibrated product rendering asset using a coverage buffer and a coverage map to generate a final image; causing displaying the final image on a display device.

20 Claims, 5 Drawing Sheets

(56) References Cited

U.S. PATENT DOCUMENTS

| | | | |
|---|---|---|---|
| 2003/0179197 A1* | 9/2003 | Sloan | G06T 15/506 345/426 |
| 2005/0081161 A1* | 4/2005 | MacInnes | G06F 18/00 715/848 |
| 2005/0155316 A1* | 7/2005 | Shipley | G06T 11/00 52/741.1 |
| 2006/0226563 A1* | 10/2006 | Albert | G03H 1/0276 428/156 |
| 2007/0083383 A1* | 4/2007 | Van Bael | G06T 11/001 715/772 |
| 2007/0165035 A1* | 7/2007 | Duluk, Jr. | G06T 15/20 345/506 |
| 2013/0173415 A1* | 7/2013 | Harvill | G06Q 30/0621 705/26.5 |
| 2014/0096041 A1* | 4/2014 | Gowen | G06Q 30/0621 715/753 |
| 2015/0002508 A1* | 1/2015 | Tatarinov | G06T 15/005 345/420 |
| 2016/0063611 A1* | 3/2016 | Davis | G06F 16/532 705/26.63 |
| 2020/0122406 A1* | 4/2020 | Bigos | B29C 64/00 |
| 2020/0294271 A1* | 9/2020 | Ilola | G06T 9/00 |
| 2022/0035970 A1* | 2/2022 | Cheshire | G06F 30/12 |

\* cited by examiner

SYSTEM AND METHOD FOR HIGH QUALITY RENDERINGS OF SYNTHETIC VIEWS OF CUSTOM PRODUCTS

BENEFIT CLAIM

This application claims the benefit under 35 U.S.C. § 119(e) of provisional application 63/104,362, filed Oct. 22, 2020, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

CROSS REFERENCE TO RELATED APPLICATIONS

This application is related to U.S. patent application Ser. No. 17/193,512, filed Mar. 5, 2021; U.S. application Ser. No. 17/038,659, filed Sep. 30, 2020; U.S. Pat. No. 8,090,461, granted Jan. 3, 2012; U.S. Pat. No. 8,175,931, granted May 8, 2012; U.S. Pat. No. 8,856,160, granted Oct. 7, 2014; U.S. Pat. No. 9,355,421, granted on May 31, 2016; U.S. Pat. No. 9,400,997, granted Jul. 26, 2016; U.S. Pat. No. 10,176,617, granted Jan. 8, 2019; and US published patent application no. 2013/0060654, filed Aug. 29, 2012; the entire contents of each of which are hereby incorporated by reference for all purposes as if fully set forth herein.

FIELD OF THE DISCLOSURE

One technical field of the disclosure is an approach for automatically configuring custom product options based on user actions monitored and tracked by collaborative computer platforms. Another technical field is tracking the user actions to generate options for customizing products available from the collaborative computer platforms and generating, based on the options, high quality renderings of synthetic views of custom products.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

There are many systems on the market that are configured to offer the users the opportunity to order products having customized attributes. For example, in the case of the custom manufactured framed products such as photos, digital images, artwork, and other frameable products, the systems may offer the users the opportunity to order the images and frames having customized sizes and colors.

Customizing the products that have many customizable parameters may be quite challenging. The selection of customization values may have implications on the appearance of the final custom products and on the way that the final custom products are rendered. Therefore, the systems often provide the functionalities for displaying depictions, i.e., synthetic views, of the customized products to help the users to visualize their customized products before the users order the products.

Generally, synthetic views are digital depictions of the objects displayed on computer-based display devices. In the context of digital customization of products, it is useful to render synthetic views of the products before the products are manufactured. This allows a user to visually check the product features and decorations before actually ordering the product. The synthetic views are often a combination of imagery from digital photography. They may include, for example, digital markups and synthetic renderings derived from, for example, 2D, 2.5D and 3D geometry of the objects.

Algorithms for high quality digital rendering of geometry have been researched and studied for some time. They typically use simulation of light, texture, and color. Major advancements in this technology include work using Scan-line Rendering, Binary Space partitioning, zBuffer, aBuffer, the Pixar's Reyes rendering system (culminating in the Renderman tool), the wide availability of hardware supporting OpenGL and Direct3D, and improvements in hardware assisted ray-tracing, as implemented in, for example, Intel's Embree rendering system.

Usually, the synthetic digital rendering methods may be grouped based on the application area, rendering speed, and quality needs. For example, the real-time rendering applications for simulation and games typically use carefully designed content and geometry rendered with optimized spatial partitioning on hardware using OpenGL or Direct3D. The rendering time for a frame in a real-time rendering application must be rapid, and usually, the latency appears to be a key barrier for supporting user interactions with the application.

In the entertainment industry, production of imagery for films and prints usually has strict requirements for the quality and creative control. Sometimes, it might be difficult to meet the high quality and artistic requirements. But even if those requirements are met, they are met at the expense of longer rendering times per image.

Rendering synthetic views for custom products falls between these two applications. Such renderings need to be crafted without the expense incurred by optimizing game assets and need to be performed as a user interacts with a product, longer than a twitch game, but much shorter than a movie frame. Therefore, there is a need for providing high quality rendering techniques for rendering synthetic views of custom products that provide relatively low latencies.

DESCRIPTION OF EXAMPLE EMBODIMENTS

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:
1.0 OVERVIEW
2.0 STRUCTURAL AND FUNCTIONAL OVERVIEW
3.0 SYNTHETIC VIEW RENDERING REQUIREMENTS
4.0 SYNTHETIC VIEW RENDERING PROCESS
  4.1 GENERATING CALIBRATED PRODUCT RENDERING ASSETS
  4.2 APPLYING USER-DRIVEN SETTINGS OF PRODUCT OPTION KEY-VALUES TO CALIBRATED PRODUCT RENDERING ASSETS
  4.3 INITIATING THE RENDERING APPLICATION
  4.4 RENDING THE ASSETS
  4.5 DISPLAYING THE ASSETS
5.0 COVERAGE MAP SERVICE
6.0 COVERAGE BUFFER SERVICE
7.0 EXAMPLE METHOD FOR HIGH QUALITY RENDERINGS OF SYNTHETIC VIEWS OF CUSTOM PRODUCTS
8.0 EXAMPLE RENDERING FLOW
9.0 MANUFACTURING
10.0 IMPLEMENTATION MECHANISMS—HARDWARE OVERVIEW
11.0 EXTENSIONS AND ALTERNATIVES 1.0 General Overview In some embodiments, techniques are described for improving a product customization process. More specifically, the techniques are intended to improve a user product renderer used by the product customization process, and to produce a rendering of the products based on a high quality sub-pixel rendering. An example of the product customization process is described in, for example, U.S. Pat. No. 8,175,931 B2, which includes a description of an example user product renderer in FIG. 1B (element 109b), FIG. 1C (element 124), and FIG. 2 (element 134). The product customization process described in U.S. Pat. No. 8,175,931 B2 does not, however, disclose the high quality sub-pixel rendering approach.

The techniques described herein provide a novel and improved method for high quality sub-pixel rendering of customized products where the high quality sub-pixel rendering is one of the critical requirements.

The system and method presented herein can be used to provide a high quality rendering of synthetic views of any custom product. The system and method can be implemented in software, hardware or a combination of hardware and software and may also be implemented on client/server system, a web server, a terminal, a peer to peer system and the like so that the system and method are not limited to the particular implementation of the system or method.

2.0 Structural Overview

Figure 1:
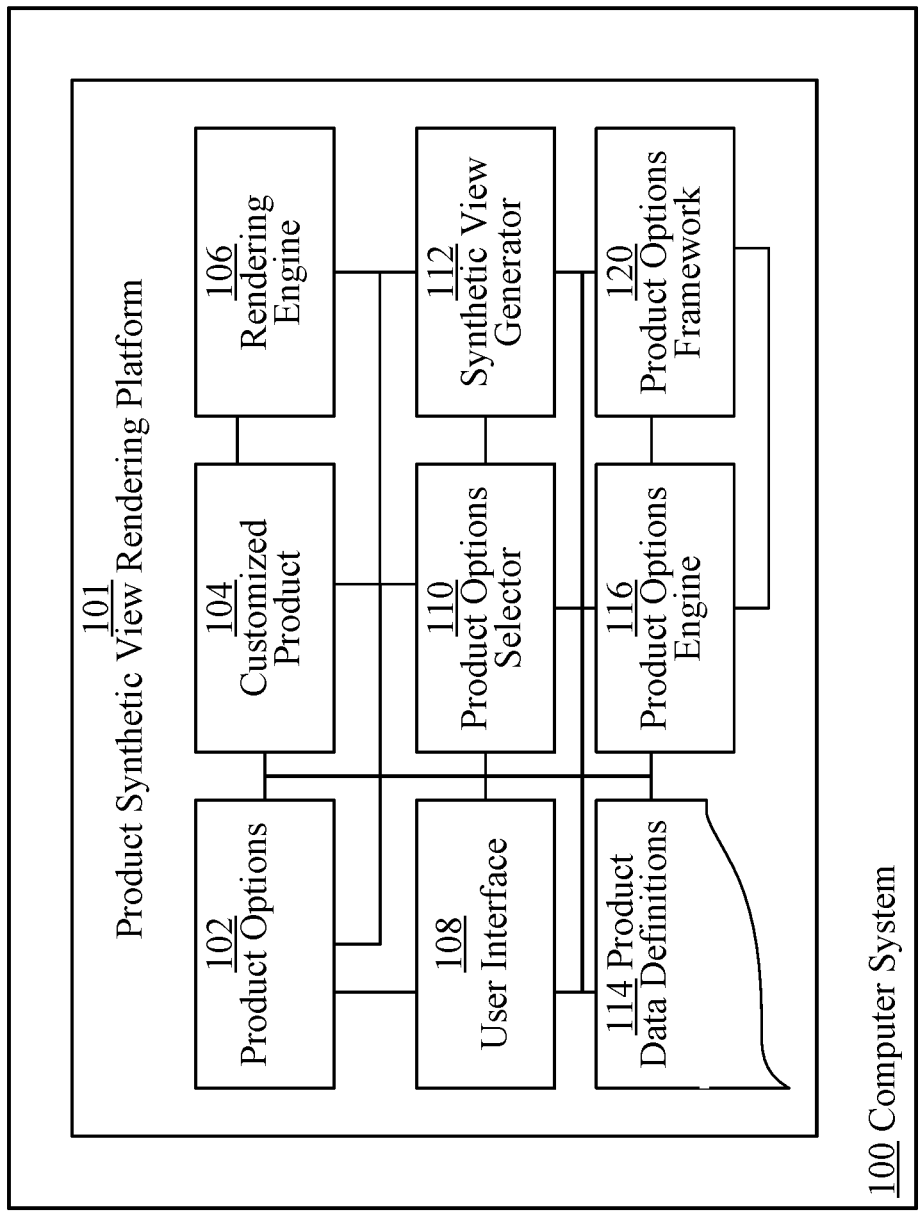
FIG. 1 illustrates an example system for implementing a method for automatically configuring custom product options based on user actions, according to some embodiments.

FIG. 1 illustrates an example system for implementing a method for high quality renderings of synthetic views of custom products, according to some embodiments. FIG. 1, the other drawing figures, and all of the description and claims in this disclosure are intended to present, disclose, and claim a technical system and technical methods in which specially programmed computers, using a special-purpose distributed computer system design, execute functions that have not been available before to provide a practical application of computing technology to the problem of machine learning model development, validation, and deployment. In this manner, the disclosure presents a technical solution to a technical problem, and any interpretation of the disclosure or claims to cover any judicial exception to patent eligibility, such as an abstract idea, mental process, method of organizing human activity or mathematical algorithm, has no support in this disclosure and is erroneous.

The depicted example is provided for illustrative purposes. It should be noted that other implementations may include different configurations of the components than those shown in FIG. 1.

In the depicted example, a product synthetic view rendering platform 101 comprises a product options module 102, a customized product 104, a rendering engine 106, a user interface 108, a product options selector 110, a synthetic view generator 112, a product data definitions 114, a product options engine 116, and a product options framework 120. Other implementations may include additional components not depicted in FIG. 1. Yet other implementations may include fewer components than those depicted in FIG. 1.

Product options module 102 may be configured to provide the functionalities for generating, modifying, and integrating product options to customize a product, which then can be sent to synthetic view generator 112 of product synthetic view rendering platform 101 for rendering. Product options module 102 may include a product options framework.

In some embodiments, product options framework 120 may be configured to provide the framework for handling the product options. It can also facilitate access to a bundling framework providing the logic to support processing attributes that are dependent on values of other attributes. The framework allows accounting for the fact that certain accessories may not fit a particular product. The framework may also allow determining compatibility both in terms of product manufacturing and capabilities of digital images of products to be visualized or rendered on display units.

In some embodiments, product options module 102 includes a bundling framework. The bundling framework comprises logic to support accurate rendering of bundled products by determining which views of combined products are valid or should be shown in a graphical user interface or other displays. In general, when products are added to a bundle, the bundling logic is configured to examine each product, filter each product based on filters as previously described, and select and order one or more generated views based on matches of the filters.

Customized product 104 may be configured to store customized products data in product synthetic view rendering platform 101. For example, customized product 104 may capture data representing the customization options selected by a user as the user customizes the product using product synthetic view rendering platform 101 and the choices that the user makes as the user navigates through the product customization options.

Rendering engine 106 may be configured to execute a rendering logic. The rendering logic may be configured to accommodate product options and bundles. In an embodiment, the rendering logic supports defining rendering files and adding elements to the rendering logic using declarative statements rather than pure programming. Attributes of views may be declared in rendering files that serve as configuration files to drive rendering processes. In an embodiment, the capabilities of the rendering logic are matched to the bundles of products through other declaratory statements and the matching syntax that are described later.

User interface 108 may be configured to facilitate interactions between rendering platform 101 and users. In an embodiment, a product bundle is defined as an association of two or more products that can be visualized together in a graphical user interface and are compatible or can be ordered together for use together or in a combined custom manufactured product.

Product options selector 110 may be configured to provide the functionalities for tracking the options selected by users as the users navigate via the user interface driven by the application executing on product synthetic view rendering platform 101.

Synthetic view generator 112 may be configured to provide the functionalities for implementing a system and method for high quality rendering of synthetic view of custom product presented herein.

Product data definitions 114 may be configured to store and provide definitions of products and various customization options for the products. Product data definitions may be processed using an attribute engine and key-value pairs, described later.

Product options engine 116 may be configured to provide the functionalities for managing various options and option configuration for the product offered to the users.

3.0 Synthetic View Rendering Requirements

In some embodiments, a product customization process permits a user to customize a product using functionalities available via a user interface. The interface may be implemented to generate and display one or more web pages on a user display device. The user interface may be configured to, for example, allow the user to interactively apply colors, tiled images, and photographic or designed images (e.g., user designed images) to a two dimensional pattern pieces that comprise the product, as described below in more detail.

Data generated by the user interface may include user account data, a product description (that describes the user's custom product), user image designs (that contains the user content), color choices (the colors chosen by the user), material choices (the type of materials for the custom product), and the finishing choices (the finishing selected by the user for the custom product). Based on that information, the user interface may assemble a set of instructions that describe the user design and request images of the final product from, for example, a user product renderer. The resulting interaction may be performed in real time.

In some embodiments, a process of rendering synthetic views of one-of-a-kind products in response to user actions has a unique set of requirements. The requirements are typically separate from the real-time or production media rendering. Examples of the requirements include the following requirements:
1. Each individual request may require new assets, so caching of textures on graphics hardware may be associated with a high latency cost.
2. Each request breaks frame-to-frame coherence strategies for optimizing rendering.
3. Each custom product has different graphic characteristics, making the special case rendering and tuning used in games and simulations less effective.
4. Requirements for rendering time or pipe latency are based on product browsing timing rather than proving a smooth frame rate or optimizing rendering for a movie frame. Typically, the rendering time for a product view may be greater than the 1/60 sec render time for a simulation, and much less than the 20 minute render time typical for a frame of a feature film. Acceptable latencies may range from 1/15 sec to 1/2 sec.
5. Image quality is expected to be high since the image depiction directly impacts the user's perception of the custom product.
6. Rendering with a high quality sub-pixel sampling is needed to resolve the complex product geometry and transparencies.

In some embodiments, the system and method described herein solve the requirements issues for high quality rendering at least for the last group of requirements, i.e., for the high quality sub-pixel rendering requirement. The solution allows resolving the complex product geometry and transparencies. The solution provides, among other things, a novel method for sampling sub-pixel geometry.

The presented system and method overcome the limitations of the low level rendering portions of the prior art, which tend to use implicit surface detection (as in Embree approach), use explicit subdivision into pixel buckets (as in Reyes approach), and use explicit scan conversion of geometry (as in Catmull '78 approach).

Embree is a kernel framework for an efficient ray tracing on x86 CPUs. Embree is directed to professional rendering environments in which scenes with high geometric complexity and indirect illumination are the norm rather than the exception. To address this, Embree provides a set of commonly used kernels optimized for different ISA vector widths, workloads (e.g., coherent and incoherent ray distributions, static and dynamic scenes), and application-specific priorities (e.g., maximal performance or minimal memory usage). Renderers built on these kernels can achieve a bounding volume hierarchies (BVH) build and ray traversal performance comparable to existing methods on many CPUs or GPUs.

Reyes is an image rendering system developed at Lucasfilm Ltd. and currently in use at Pixar. Reyes provides an architecture optimized for fast high-quality rendering of complex animated scenes, i.e., to be able to compute a feature-length film in approximately a year. It provides high-quality means that are virtually indistinguishable from live action motion picture photography and complex means as visually rich as real scenes.

The explicit scan conversion of geometry, as in Catmull, implements a hidden-surface algorithm with anti-aliasing. The aliasing problems usually include jagged edges, small objects popping on and off the screen in successive frames, moire patterns in rendering periodic images, fine detail breaking up, and so on. The problem occurs mainly because the image space is sampled at discrete points corresponding to the pixels. Catmull's hidden surface algorithm includes, among other things, sorting all polygons on highest "y" value, initializing an active polygon list to be empty, and repeating for each scanline: adding polygons from y-list that enter this scanline to active polygon list, initializing the x-bucket to be empty the scanline array to background, and looping through each polygon in an active polygon list by performing specific clipping, replacing, and sorting operations on the polygons.

In some embodiments, the presented system and method overcome the limitations of the techniques for handling sub-pixel transparency or anti-aliasing, including accumulated jittered random sampling, accumulating micro-polygons, or using a modified Reyes to store transparency and color data in an A-Buffer.

An A-buffer (i.e., anti-aliased, area-averaged, accumulation buffer) is a general hidden surface mechanism suited to medium scale virtual memory computers. It resolves visibility among an arbitrary collection of opaque, transparent, and intersecting objects. Using an easy to compute Fourier window, it increases the effective image resolution many times over the Z-buffer with a moderate increase in cost.

In some embodiments, the presented system and method overcome the limitations of other methods with respect to the availability of computer memory by utilizing, for example, the A-Buffer algorithms to store coverage data.

In some embodiments, the system and method described herein use a hybrid approach, which explicitly relies on scan converting, but implicitly relies on deriving sub-pixel coverage using modern scalar instructions, and a carefully constructed coverage data set to perform the implicit calculations.

4.0 Synthetic View Rendering Process

Figure 2:
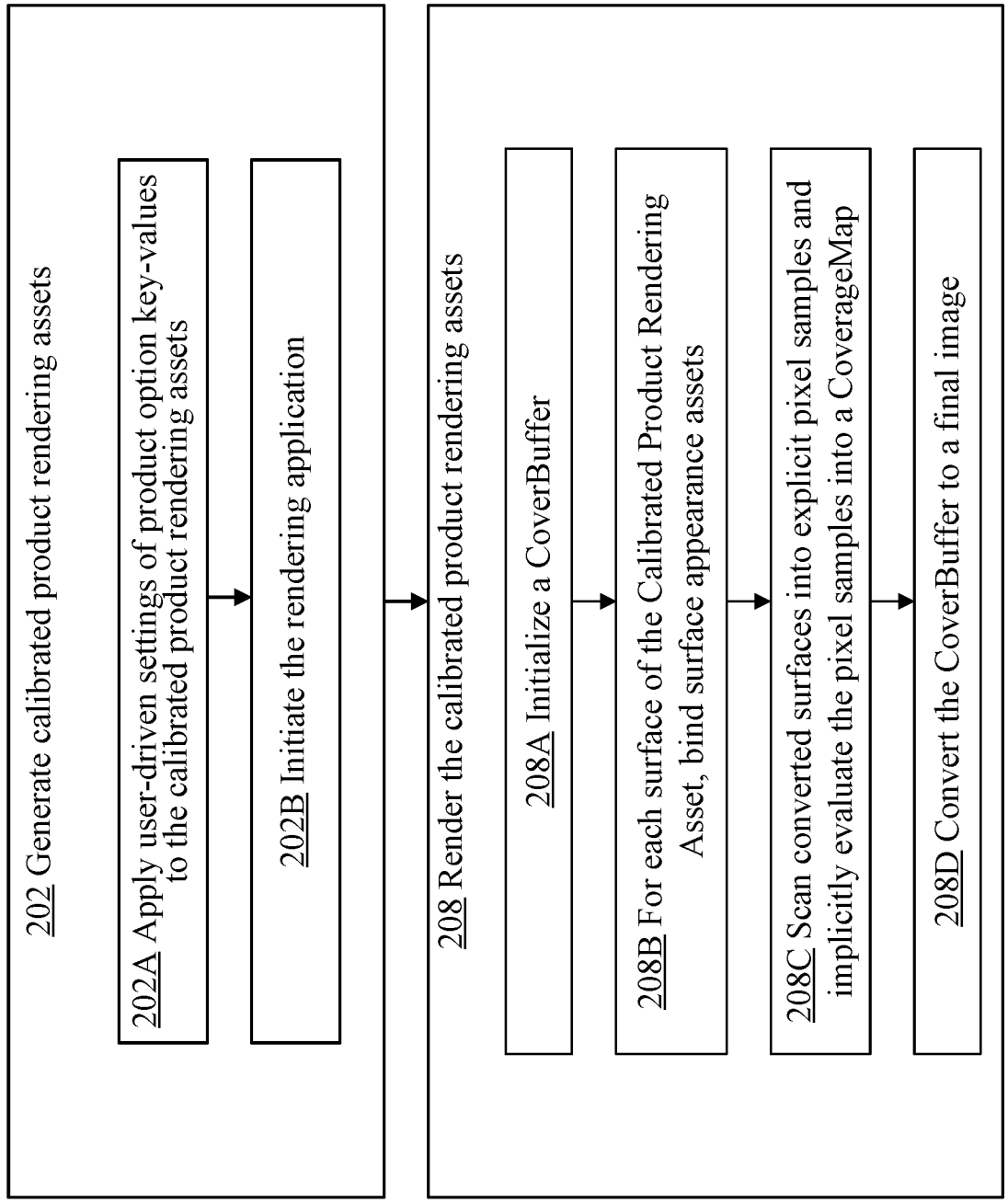
FIG. 2 illustrates an example processing flow for rendering synthetic views, according to some embodiments.

FIG. 2 illustrates an example processing flow for rendering synthetic views, according to some embodiments. The steps described in FIG. 2 may be performed using the components of product synthetic view rendering platform 101, described in FIG. 1.

4.1 Generating Calibrated Product Renderings Assets

In step 202, a process of generating a synthetic view rendering begins from generating calibrated product renderings assets. The calibrated product rendering assets may be generated by creating a digital representation of a referenced physical product. A referenced physical product may be produced using designated colors and patterns. The colors and patterns may be generally referred to as "markups."

A markup is recognized and used to construct geometry, design areas, masks, local surface shading, and global luminance shading. The geometry, luminance maps, and color maps are usually tied to product options key-values.

4.2 Applying User-Driven Settings of Product Option Key-Values to Calibrated Product Rendering Assets In step 202A, as part of generating the calibrated product rendering assets, user-driven settings of product option key-values are applied to the calibrated product rendering assets. This may include setting a substrate, trim, or other key-values associated with color or textural appearance. A substrate may be the material from which the product is made. For example, the substrate for a poster is paper, the substrate for a t-shirt is a cotton cloth, the substrate for a phone case may be polycarbonate, and so forth. In some embodiments, texture assets and color maps may be set by reference.

In some embodiments, applying the product option key-values also includes setting design areas associated by key-value. This may include setting design area references by, for instance, setting an image to render into a design U-V geometry specified by a markup.

In some embodiments, applying the product option key-values also include setting product parametric key-values. This may include transforming the geometry features and placements. The keys for a particular product may include a product height, a product width, a product depth, a product circumference, a placement of designs, a design height, a design width and the like.

In some embodiments, trim geometry features and placements are transformed. The transformation may include fitting the framing or edging to the geometry features and setting physical profiles of framing or edging.

In some embodiments, view parameters are set. This may include setting geometry transforms to a specific view. This may also include setting in-situ transforms.

4.3 Initiating the Rendering Application

In step 202B, a rendering application is initiated. In this step, a CoverageMap service is initialized. The CoverageMap service is described later.

4.4 Rendering the Assets

In step 208, the assets are rendered. In this step a Coverage buffer service is initialized. The Coverage buffer service is described later.

Then, for each surface in the calibrated product rendering asset, the following is performed: in step 208A, the surface appearance assets are bound to the corresponding colors, textures, designs, parametric shading, and the like.

Then, in step 208B, for each polygon in the calibrated product rendering asset, a hybrid scanline and implicit structure are built. This may include determining triangle points, triangle deltas, and ImplicitTriangles.

In step 208C, the converted surfaces are scanned into explicit pixel samples and the pixel samples are implicitly evaluated into a CoverageMap.

In some embodiments, each triangle is scan-converted by performing the following: for each X,Y pixel in the scan, the ImplicitTriangle is evaluated using the CoverageMap Service. If the X,Y pixel is fully inside the polygon, then a default full CoverageMap is set. However, if the X,Y pixel is partially inside the polygon, then a CoverageMap is calculated. Then, the pixel is set in the Coverage buffer. If the pixel is visible, then the pixel is shaded.

In step 208D, the Coverage buffer is converted to a final image. This is described in detail later.

4.5 Displaying the Assets

Figure 3:
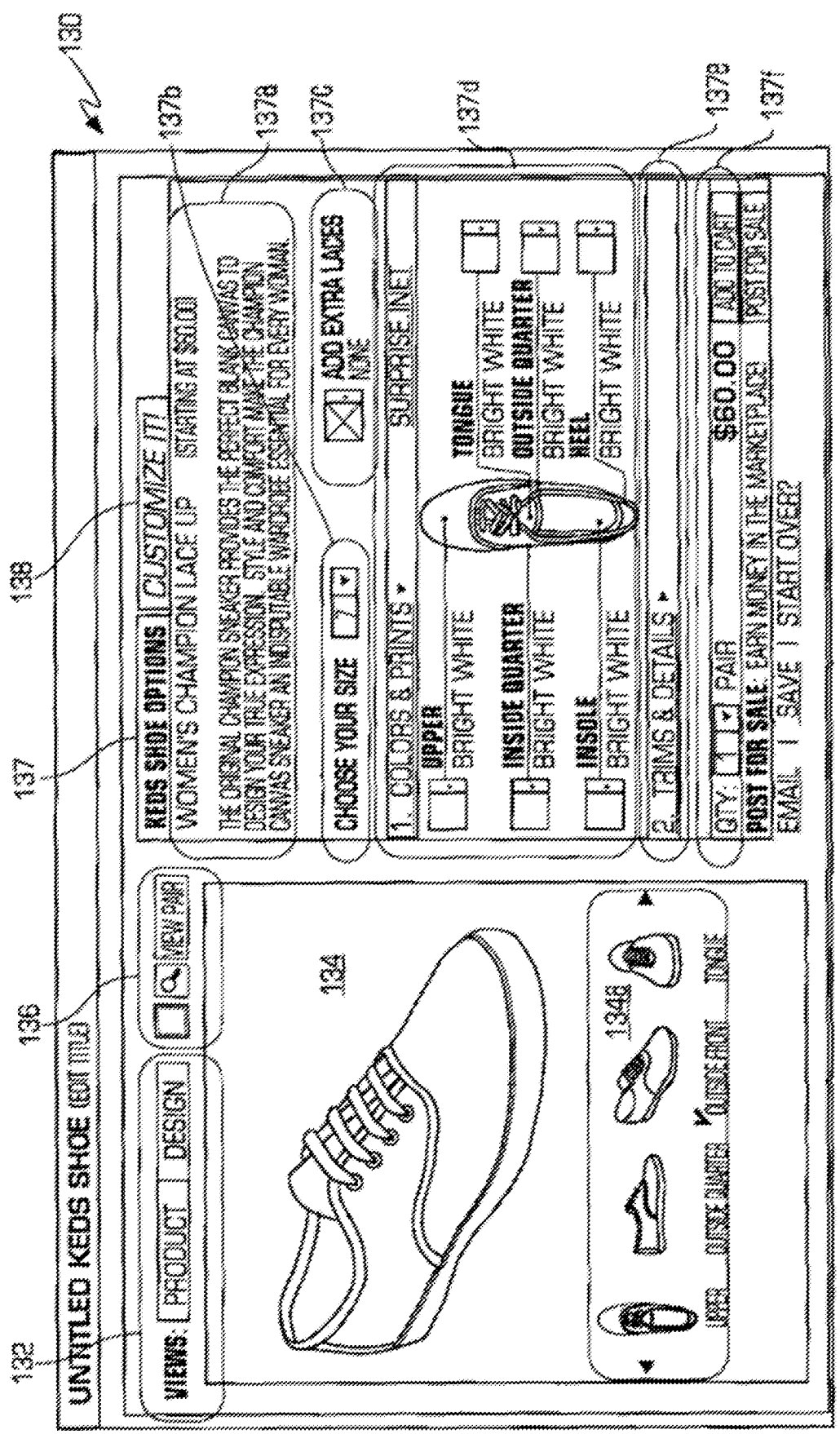
FIG. 3 illustrates an example of a user interface of a product customization system, according to some embodiments.

FIG. 3 illustrates an example of a user interface 130 of the product customization system, according to some embodiments. The depicted example shows an example of a rendered image 134, which corresponds to a rendered image 134 shown in FIG. 2 of U.S. Pat. No. 8,175,931 B2.

The user interface may include a view option portion 132 that allows the user/consumer to select between a product view or a design view in a view portion 134. The view portion also has a view selector 134a that allows the user/consumer to select among the views (upper, outside quarter, outside front or tongue, for example) to be displayed in the view portion. The user interface may also include a view tools portion 136 that allows the user to replace or delete a portion of the view (dotted box tool), zoom the view (the magnifying glass tool) and/or view the pair of products together in the view portion.

The user interface further comprises a product options tab 137 (a Keds Shoe option tab because the product in the example is a Keds shoe) that allows the user to select various product options (such as colors and patterns for the design area and for accessories) and a customize it a tab 138 that allows the user to customize the product with user content as described below in more detail. As shown, the product options tab (herein the product is a shoe) may further include a product summary portion 137a that displays a summary of the particular product, a size portion 137b that allows the user to select the appropriate size of the product, an extra laces portion 137c that allows the user to select extra laces to be purchased with the customized product, a color and prints portion 137d that allows the user to select a color and/or print for each piece of the product (such as the upper, tongue, inside quarter, insole, heel and outside quarter in the shoe example), a trims and detail user interface 137e that allows the user to select certain trims and details for the product and a commerce portion 137*f* that allows the user to select a quantity of products to purchase, shows the accumulated price of the products and allows the user to add the customized products to an electronic shopping cart.

5.0 Coverage Map Service

The core of the presented approach is a CoverageMap service. The CoverageMap service provides the evaluation of an ImplicitTriangle and provides a coverage map for, for example, a 16×16 sub pixel area. The CoverageMap service may be implemented in many ways. Below is an example of one possible implementation of the CoverageMap Service. It should be noted that this embodiment is tuned to a specific scalar instruction set, so other instruction sets may require separate embodiments.

In some embodiments, a CoverageMap structure is designed to represent a single edge of a polygon, and to evaluate the 16×16 binary coverage of that edge for any X,Y pixel. The structure may contain:

1. coverage, a 256 bit vector containing the 16×16 coverage map, and
2. centroid, a 128 bit vector containing 4 single precision floating point values containing the sampling point for the CoverageMap that corresponds to a coverage area.

The CoverageMap service may evaluate an X,Y pixel against a single edge, the edge may be represented by an edge, a 128 bit vector containing 4 single precision floating point values describing the edge holding a, b, c, d; where a, b is the normal of a 2d edge, c is the offset from the normal to 0,0 for the edge, and d is the distance from the upper left corner of a pixel to its center.

In one implementation, the CoverageMap service is represented by an Intel_m256i register defined in the AVX2 instruction set (see imminitrin.h Meta Header file for Intel® Architecture intrinsic functions).

In one implementation, the centroid is represented by an Intel_m128 register referenced in the SSE4.1 instruction set (see smmintrin.h, Meta Header file for Intel® Architecture intrinsic functions).

In one implementation, an edge is represented by an Intel_m128 register referenced in the SSE4.1 instruction set (see smmintrin.h, Meta Header file for Intel® Architecture intrinsic functions).

An example of a pseudo-code for one implementation of the CoverageMap is provided below:

```
/**
* CoverageMap
* A structure to hold a 16x16 binary coverage map.
* It will return the area of the map, and perform
* Boolean operations on it.
*/
struct _align__(32) CoverageMap
{
public:
  union {
    __m256i coverage;
    struct { uint64 a, b, c, d; };
  };
  embree::Vector4f centroid;
  __forceinline CoverageMap( ) { }
  __forceinline ~CoverageMap( ) { }
  __forceinline CoverageMap(uint64 n)
  {
    coverage = _mm256_set1_epi64x(n);
  }
```

```
  __forceinline CoverageMap(const CoverageMap & q)
  {
    coverage = q.coverage;
    centroid = q.centroid;
  }
  /**
  * Returns the area this map covers of a single pixel.
  * @returns the area of coverage 0...255.
  */
  static __forceinline int32 area(__m256i & map)
  {
    uint64 n = _mm_popcnt_u64(map.m256i_u64[0]);
    n += _mm_popcnt_u64(map.m256i_u64[1]);
    n += _mm_popcnt_u64(map.m256i_u64[2]);
    n += _mm_popcnt_u64(map.m256i_u64[3]);
    return((int32)n);
  }
  /**
  * Returns the area this map covers of a single pixel.
  * @returns the area of coverage 0...255.
  */
  __forceinline int32 area( )
  {
    uint64 n = _mm_popcnt_u64(a);
    n += _mm_popcnt_u64(b);
    n += _mm_popcnt_u64(c);
    n += _mm_popcnt_u64(d);
    return((int32)n);
  }
  /**
  * Clears the map
  */
  __forceinline void clear( )
  {
    a = 0;
    b = 0;
    c = 0;
    d = 0;
    centroid = embree::Vector4f(0.0f);
  }
  /**
  * Intersects this map with another map
  * @param The map to intersect this map with.
  */
  __forceinline void intersect(CoverageMap & q)
  {
    coverage = _mm256_and_si256(coverage, q. coverage);
  }
  /**
  * Unions this map with another map
  * @param The map to combine this map with.
  */
  __forceinline void combine(CoverageMap & q)
  {
    coverage = _mm256_or_si256(coverage, q. coverage);
  }
  /**
  * Subtracts another map from this map.
  * @param The map to subtract from this map.
  */
  __forceinline void difference(CoverageMap & q)
  {
    coverage = _mm256_andnot_si256(q.coverage, coverage);
  }
  /**
  * returns the centroid for this map
  * @param The returned centroid for this map
  */
  __forceinline void getCentroid(embree::Vec2f & n)
  {
    n.x = centroid.x;
    n.y = centroid.y;
  }
};
```

Note that the Boolean area operations on the CoverageMap, intersect, combine, and difference are performed by a single scalar instruction taking a single clock cycle. This allows for very fast calculations of sub-pixel rendered regions. Note also that the area may be computed using scalar instruction popcnt( ) operations, this allows for the fast conversion of a coverage area into an opacity.

The number of possible edges in a 16×16 sub pixel array is relatively small. In one embodiment, an array of all possible edges may be represented by 256 angles and 512 subpixel distances from the upper left corner of the array. In one embodiment the pixel distance for distance are sqrt(2.0)/512.0, and the angular units are (2.0*PI( )/256.0.

An example of a pseudo-code for one implementation of building this array (using embree::math.h for intrinsics) is provided below:

```
/**
 * Builds the look-up table to map angles and distance to coverage.
 */
void buildCoverageMapLook( )
{
  mapLook.resize(512 * 256);   // fixed size of coverage map look-up
  int32 mapDex = 0;
  for (int32 i = 0; i < 256; i++)
  {
    float angle = (float)i * ((float)embree::TwoPiTy( ) / 256.0f);
    for (int32 j = 0; j < 512; j++)
    {
      float d = (float)j * (gSqrtTwo / 512.0f);
      d = d - gHalfSqrtTwo;
      embree::Vector4f edge = embree::Vector4f(embree::cos(angle), embree::sin(angle), d, 0.0f);
      CoverageMap map;
      double accumX = 0.0;
      double accumY = 0.0;
      double accumCount = 0;
      for (int32 ii = 0; ii < 16; ii++)
      {
        float y = ii * (1.0f / 15.0f) - 0.5f;
        uint16 scanLine = 0;
        for (int32 jj = 0; jj < 16; jj++)
        {
          float x = jj * (1.0f / 15.0f) - 0.5f;
          embree::Vector4f sample = embree::Vector4f(x, y, 1.0, 0.0f);
          float nd = embree::dot(edge, sample);
          if (nd < 0)
          {
            accumX + = x;
            accumY + = y;
            accumCount + = 1.0;
            scanLine |= 1<< jj;
          }
        }
        map.m256.coverage_u16[ii] = scanLine;
      }
      if (accumCount > 0)
      {
        accumX = accumX / accumCount;
        accumY = accumY / accumCount;
      }
      map.centroid = embree::Vector4f((float)accumX, (float)accumY, 0.0f, (float)(accumCount));
      mapLook[mapDex] = map;
      mapDex++;
    }
  }
}
```

A pixel coordinate may also be represented by a _m128 register. It may be converted so that a dot product with the edge structure may produce a distance from the edge if the pixel is in the form x, y, 1, 1.

It is useful to quickly prepare a given integer X,Y pixel for evaluation against an edge.

An example of a pseudo code for a possible implementation for this conversion is described below:

```
/**
 * Builds a pixelCoord for calculating pixel coverage.
 * @param the pixel's x location
 * @param the pixel's y location
 * @returns a Vector4f of the pixel coordinate to perform coverage calculations.
```

```
*/
static __forceinline embree::Vector4f pixelCoord(int32 x, int32 y)
{
    __m128i origin = _mm_set_epi32(1, 1, y, x);  // note set is in order(3, 2, 1, 0)
    embree::Vector4f coord = _mm_cvtepi32_ps(origin);    // fast convert to float
    coord += embree::Vector4f(0.5f, 0.5f, 0, 0);    // round
    return(coord);
}
```

Now the converted pixel may be implicitly evaluated by the edge quickly with a dot product. This can be done in 1.5 clock cycles using the _mm_dp_ps( ) intrinsic function.

An example of a pseudo-code for a possible implementation of evaluating the pixel and returning a CoverageMap is included below:

```
/**
 * Makes a coverage map for an edge and a pixel.
 * @param the edgeAngle
 * @param the pixelCoord
 * @param the found CoverageMap
 * @param the found centroid
 * @returns the index of the found coverageMap.
 */
__forceinline int32 coverageMap(
    embree::Vector4f& edge,
    embree::Vector4f& pixel,
    CoverageMap& map)
{
    float d = embree::dot(edge, pixel);
    if (d < 0)
    {
        map = CoverageMap(0xffffffffffffffff);
        map.v = embree::Vector4f(0, 0, 0, 256.0f);
        return(0);
    }
    if (d >= gSqrtTwo)
    {
        map = CoverageMap(0);
        map.v = embree::Vector4f(0.0f);
        return(511);
    }
```

```
    d *= (512.0f / gSqrtTwo);
    d = floorf(d);
    int32 angle = normalToAngle(edge) & 255;
    int32 mapDex = (angle * 512) + (int32)d;
    map = mapLook[mapDex];
    return(mapDex);
}
```

It is worth noting that most pixel evaluations may be fully within the edge, or outside it, so the fast evaluation using the intrinsic scalar dot product instruction may be applied. The evaluation of an ImplicitTriangle may be optimized by performing three dot-product edge evaluations for a quick accept/reject.

6.0 the Coverage Buffer Service

Once the scan converted pixel for a triangle is positively evaluated, a CoverageMap may be added to the Coverage buffer.

In one implementation, the Coverage buffer is a 2D array of 32-bit integers that are the start of an indexed list of CoverPix structures. On initialization, the array is set to the size of the image to be rendered, and its values are set to −1 to indicate that they are empty.

A CoverPix is an intermediate representation of a shaded pixel that holds shading and surface data, an index to a CoverageMap, a SurfaceID, and compositing information.

An example of pseudo code for a possible implementation of a CoverPix is shown below:

```
struct CoverPix
{
    /**
     * CompositeOp declaration.
     * @param The CoverPixel atop the dest.
     * @param The pixel beneath the CoverPixel.
     */
    typedef float (*CompositeOp)(CoverPix& top, embree::Vector4f &dest);
    embree::Vector4f color;        // the shaded color of this pixel
    CompositeOp compositeOp;       // the compositing operation tao apply this pixel
    float depth;                   // the depth for this pixel
    float coverage;                // the coverage of this pixel
    int32 next;                    // the next pixel in z order
    int32 mapDex;                  // the coverage map index
    uint64 surfId;;                // the surface ID for this pixel
        __forceinline CoverPix( ) {        // Nothing set here for speed. Use Coverage
}
buffer::set( ) to allocate.
        __forceinline ~CoverPix( ) { }
        __forceinline CoverPix(const CoverPix& a)
        {
            color = a.color;
            depth = a.depth;
            compositeOp = a.compositeOp;
            mapDex = a.mapDex;
```

```
        coverage = a.coverage;
        next = a.next;
        surfId = a.surfId;
    }
}
```

In some embodiments, the Coverage buffer holds a resizable array of CoverPix and CoverageMaps. When a shaded pixel is added to the Coverage buffer, a CoverPix and CoverageMap are allocated for them (if needed) and they are placed into a z-ordered linked list in the Coverage buffer.

An example of pseudo code of a possible implementation of the Coverage buffer structure is shown below:

```
struct Coverage buffer
{
  typedef std::vector<CoverPix> PixList;
  typedef std::vector<CoverageMap> MapList;
  std::vector<PixList> pixLists;
  std::vector<MapList> mapLists;
  cv::Mat coverBuff;
  Coverage buffer( ) { }
  ~Coverage buffer( ) { }
  Coverage buffer(const Coverage buffer& a)
  {
    pixLists = a.pixLists;
    mapLists = a.mapLists;
    coverBuff = a.coverBuff;
  }
  Coverage buffer(int32 width, int32 height)
  {
    build(width, height);
  }
  /**
  * Builds the Coverage buffer, allocating coverBuff, pixes, and maps.
  * @param The width of the rendering area.
  * @param The height of the rendering area.
  */
  void build(int32 width, int32 height)
  {
    coverBuff = cv::Mat(height, width, CV_32SC1);
    coverBuff = -1;
```

```
    pixLists.resize(height);
    mapLists.resize(height);
    CoverageMap map(0xffffffffffffffff);
    map.v = embree::Vector4f(0, 0, 0, 256.0f);
    for (int32 i = 0; i < height; i++)
    {
      pixLists[i].reserve(width * 3);
      mapLists[i].reserve(width >> 1);
      mapLists[i].push_back(map);   //reserve full coverage map as
                                    index 0.
    }
  }
}
```

In this implementation, the CoverPix and CoverageMaps are allocated as arrays for each "x" scanline. This is to allow multithreaded rendering of the image by scanline areas. When a shaded scan-converted pixel is placed into the map, if it is determined that pixel of the Coverage buffer is empty, then it may just be allocated and set. If the new pixel falls behind another pixel in the map that is fully opaque, it may be ignored. If the new pixel has the same surfaceID and matches the "z" depth of a pixel in the Coverage buffer, then it may be combined into the existing CoverPix of that surface. If none of these are the case, then a new CoverPix is allocated, and its index is sorted into the linked list of CoverPix ids for its X,Y location.

Shading the pixel is the most expensive single operation, so it is performed only if the pixel will contribute to the rendering.

An example of pseudo code of an implementation of the Coverage buffer::set function, along with helper functions, is described below:

```
/**
* Pushes a map onto the mapLists.
* @param The map to push.
* @param The scanline index for the mapLists
* @returns The index for this scanline for the new map.
*/
__forceinline int32 pushMap(CoverageMap &map, int32 y)
{
  int32 mapDex = mapLists[y].size( );
  mapLists[y].push_back(map);
  return(mapDex);
}
/**
* Pushes a CoverPix onto the pixLists.
* @param The CoverPix to push.
* @param The scanline index for the pixLists
* @returns The index for this scanline for the new CoverPix.
*/
__forceinline int32 pushPix(CoverPix &pix, int32 y)
{
  int32 pixDex = pixLists[y].size( );
  pixLists[y].push_back(pix);
  return(pixDex);
}
/**
* Sorts a pixel into the Coverage buffer
* @param The source ScanShader
* @param The ShadePoly context for setting the pixel.
* @param the horizontal offset in pixels.
```

```
     * @param the vertical offset in pixels.
     * @param the compositing operation for the pixel
     */
    void set(RasterShader &shader, ShadePoly &context, int32 x, int32 y)
    {
        embree::Vector4f coord = CoverageMapping::pixelCoord(x, y);        // the
coord for CoverageMapping
        if (context.update(*gCoverage, coord))                             // update the poly
        {
            PixList& pixes = pixLists[y];
            MapList& maps = mapLists[y];
            int32* buff= (int32*)coverBuff.ptr(y, x);                      // the pixel is
within sub-pixel limits.
            embree::Vector4f cSample = context.centerSample(coord);
            float depth = cSample[2];
            if (buff[0] < 0)                                               // if there is no CoverPix
set in the buffer...
            {
                shader.shadePixel(context);                                // shade the pixel.
                CoverPix pix;
                pix.color = context.pixel;
                pix.depth = depth;
                pix.setOp(shader.blendMode);
                pix.next = −1;
                pix.surfId = shader.id;
                if (context.cMap.v.w == 256)                               // if there is full
pixelcoverage...
                {
                    pix.mapDex = 0;                                        // use pre-allocated
full CoverageMap
                    pix.coverage = 1.0f;
                }
                else
                {                                                          // else we need to allocate a
CoverageMap
                    int32 mapDex = pushMap(context.cMap, y);               // from the
context's coverage map.
                    pix.mapDex = mapDex;
                    pix.coverage = context.cMap.v[3] * (1.0f / 256.0f);
                }
                int32 thisDex = pushPix(pix, y);                           // save the CoverPix
to the list
                buff[0] = thisDex;                                         // place the CoverPix
index in buffer
            }
            else
            {
                int32 nextDex = buff[0];                                   // the current index
                bool hidden = pixes[nextDex].depth < depth &&              // fast return on
occulution.
                    pixes[nextDex].color[3] > 0.999f &&
                    pixes[nextDex].coverage > 0.999f;
                if (!hidden)
                {
                    int32*lastRef = buff;                                  // the forward link to
fix.
                    int32 curDex = nextDex;
                    float zDiff = pixes[nextDex].depth − depth;
                    while (nextDex >= 0 &&                                 // traverse list for
insertion sort.
                        (pixes[nextDex].depth − depth) > −gCoverage bufferZTolerance)
                    {
                        curDex = nextDex;
                        zDiff = pixes[curDex].depth − depth;
                        nextDex = pixes[curDex].next;                      // update the current
index.
                        lastRef = &pixes[curDex].next;                     // update the
forward link
                    }
                    bool sameSurface = curDex >= 0 &&
                        pixes[curDex].surfId == shader.id &&
                        embree::abs(zDiff) < gCoverage bufferZTolerance;
                    if (sameSurface)
                    {
                        CoverageMap& currentMap = context.cMap;
                        float currentCoverage = currentMap.v.w * (1.0f / 255.0f);
                        float combinedCoverage = currentCoverage +
pixes[curDex].coverage;
                        sameSurface = combinedCoverage <= 1.1f;
```

```
            if (!sameSurface)
            {
              if (zDiff > 0)
              {
                curDex = nextDex;
              }
            }
          }
          if (sameSurface )
          {
                              //Pixels at the same depth and with the same surfId
                              //are treated as the same surface.
            CoverageMap& currentMap = context.cMap;
            if (pixes[curDex].coverage < 1.0f)           // if surface not already shaded....
            {                                            // we need to combine sub-pixel coverage.
              float c0 = currentMap.v.w;                 // c0 is the coverage of the source in subpixels (0...256)
              {
                float c1 = pixes[curDex].coverage;       // c1 is the coverage of the destination map
                CoverageMap& destMap =
                  maps[pixes[curDex].mapDex];
                CoverageMap temp = destMap;
                temp.difference(currentMap);
                float c2 = temp.area( );                 // c2 = pixes[curDex].map – currentMap;
                {
                  float sum = c2 + c0;                   // sum is total coverage of combined maps
                  if (sum)
                  {
                    shader.shadePixel(context);
                    c0 = c0 / sum;                       // c1 is now the source contribution
                    c2 = c2 / sum;                       // c2 is now the dest contribution.
                    pixes[curDex].color =
                      pixes[curDex].color * c2 +
                      context.pixel * c0;                // calc the new dest color
                    currentMap.combine(destMap);         // union the src and dest maps.
                    currentMap.v.w = currentMap.area( ); // update the map's area
                    if (currentMap.v.w != 256)           // if not full coverage
                    {
                      if (pixes[curDex].coverage == 256) // if the existing map used pre-allocated full coverage...
                      {
                        // allocate a new map
                        pixes[curDex].coverage =
                          currentMap.v.w * (1.0f / 256.0f);
                        int32 mapDex = pushMap(currentMap, y);
                        pixes[curDex].mapDex = mapDex;
                      }
                      else
                      {
                        pixes[curDex].coverage =
                          currentMap.v.w * (1.0f / 256.0f);
                        destMap = currentMap;            // if it is already an allocated map, just set it.
                      }
                    }
                    else
                    {
                      pixes[curDex].mapDex = 0;          //it is full coverage, so use pre-allocated full coverage map.
```

-continued

```
                pixes[curDex].coverage = 1.0f;
                if (pixes[curDex].color[3] > 0.999f)
                {
                  buff[0] = curDex;
                }
              }
            }
          }
        }
      }
    }
  }
  else
  {
    // the new pixel does not match a destination map level.
    shader.shadePixel(context);                    // shade the pixel
    CoverPix pix;
    pix.color = context.pixel;
    pix.depth = depth;
    pix.setOp(shader.blendMode);
    pix.next = nextDex;
    pix.surfId = shader.id;
    if (context.cMap.v.w == 256)                   // if it is full
coverage...
    {
      pix.mapDex = 0;                              // use the pre-
allocated map.
      pix.coverage = 1.0f;
    }
    else
    {                                              // need to allocate a
coverage map...
      pix.coverage =
        context.cMap.v.w * (1.0f / 256.0f);
      int32 mapDex = pushMap(context.cMap, y);
      pix.mapDex = mapDex;                         // set the pointer.
    }
    int32 thisDex = pushPix(pix, y);               // allocate the pixel
    *lastRef = thisDex;                            // link into the list
    if (context.cMap.v.w == 256)                   // if it is full
coverage...
    {
      if (pix.color[3] > 0.999f)                   // if it is opaque...
      {
        buff[0] = thisDex;                         // drop all further
pixels.
      }
    }
  }
}
```

Piecewise fitting based on coverage is performed if the pixels are on the same surface. Piecewise fitting is performed using the Boolean operations provided by the CoverageMap service. These calculations, intersect, difference, and combine may be performed using single inline scalar instructions. Note that the "z" linked list is sorted furthest from the view to closest. This allows to quickly reject the occultation and is the same order the pixels will be composited.

Once all the polygons have been scan converted, and the Coverage buffer is fully set, it may be traversed and composited into the final image. This is done by traversing each pixel's linked list, applying compositions in the linked order.

An example of pseudo code of one possible implementation of this compositing for the Coverage buffer is described below:

```
/**
 * Composite each pixel list in the Coverage buffer to a destination image.
 * @param The destination image.
 */
void compositeCoverage(cv::Mat& dest, embree::Vector4f fillColor)
{
  __m128i shuffle32to8;
  shuffle32to8.m128i_u64[0] = 0x808080800C080400;
  shuffle32to8.m128i_u64[1] = 0x8080808080808080;
  CoverageMap fillMap;
```

-continued

```
    if (fillColor[3] > 0.0)
    {
      fillMap = CoverageMap(0xffffffffffffffff);
      fillMap.v = embree::Vector4f(0, 0, 0, 256.0f);
    }
    else
    {
      fillMap = CoverageMap(0);
      fillMap.v = embree::Vector4f(0, 0, 0, 0);
    }
    if (dest.cols == coverBuff.cols &&
      dest.rows == coverBuff.rows)               // size must match
      {
        if (dest.type( ) == CV_8UC4)             // if dest is 8bit 4 channel...
        {
          int32* srcBuff = (int32*)coverBuff.ptr( );
          int32 coverStride = coverBuff.step[0] / sizeof(int32);
          uint32* destBuff = (uint32*)dest.ptr( );
          int32 destStride = dest.step[0] / sizeof(uint32);
          for (int32 i = 0; i < dest.rows; i++)  // traverse the rows
          {
            MapList& maps = mapLists[i];
            PixList& pixes = pixLists[i];
            int32 tempMapDex = maps.size( );
            maps.push_back(fillMap);
            int32* src Scan = srcBuff;
            uint32* dstScan = destBuff;
            for (int32 j = 0; j < dest.cols; j++)  // traverse the columns.
            {
              int32 currPix = srcScan[0];
              CoverPix destPix;
              maps[tempMapDex] = fillMap;
              destPix.color = fillColor;
              destPix.coverage = fillMap.v.w * 1.0f / 256.0f;
              destPix.depth = HUGE_VALF;
              destPix.mapDex = tempMapDex;
              while (currPix >= 0)                 // traverse the CoverPix list.
              {
                CoverPix::compositeCoverage(pixes[currPix], destPix, maps);
                currPix = pixes[currPix].next;     // advance to next CoverPix.
              }
              destPix.color =
                embree::min(destPix.color, embree::Vector4f(1.0f));  // clip to 1.0.
              __m128i dest8bit =
                _mm_cvtps_epi32(destPix.color * 255.0f);  // convert from floats to 32 bit integers
              dest8bit =
                _mm_shuffle_epi8(dest8bit, shuffle32t08);  // convert from 32 bit integers to unsigned 8 bit components.
              dstScan[0] = dest8bit.m128i_u32[0];  // set the dest
              srcScan++;                           // step to next pixel in scanline
              dstScan++;
            }
            srcBuff += coverStride;               // step to next scanline.
            destBuff += destStride;
          }
        }
      }
  }
```

In some embodiments, all shaded values are pre-multiplied by alpha, and top pixel's coverage*alpha is used as a combined scalar for applying a PixCover's shaded value.

In some embodiments, complex scenes may be composed using piecewise surface occlusion using techniques similar to those described for piecewise fitting.

In some embodiments, the compositing operations may be described by enumeration. An example is described below:

```
// blend mode for compositing within Coverage buffer.
enum BlendMode
{
  Over = 0, // dst = (src * src.alpha) + (dst * (1−src.alpha))
  Mul = 1,  // dst = dst * src;
  Copy = 2, // dst = src
  Add = 3,  // dst = dst + src;
  Sub = 4,  // dst = dst−src;
```

```
    Min = 5, // dst = MIN(src,dst);
    Max = 6, // dst = MAX(src,dst);
};
```

After rendering using the presented high quality rendering approach, the rendered image is shown as element 134 described in FIG. 3, which corresponds to the image (element 134), generated using a different approach and is shown in FIG. 2 in U.S. Pat. No. 8,175,931 B2. It is worth noting that the sub-pixel rendering portion of the rendering adds about 20% to the rendering time while providing a virtual 16× in linear resolution.

7.0 Example Method for High Quality Renderings of Synthetic Views of Custom Products In some embodiments, a method for high quality renderings of synthetic view of custom manufactured product comprises rendering of an image of the custom manufactured product where instructions for manufacturing the product are provided by a ProductOptions framework composed of a set of constrained key-value pairs.

In some embodiments, a product option may be represented as a key-value pair. The key-value pair is a label that may span individual products and represent a class of products. The keys of pairs may include a material type, a color, a size, and the like.

The value in a key-value pair is a specific discrete or continuous value that sets a manufacturing instruction. Examples of discrete (enumerated) values may include a discrete type of fabric such as cotton, cotton-polyester blend, silk, and the like. The discrete values may also include specific colors, such as white, navy, black, and the like.

Examples of continuous values of key-value pairs may include a single element, such a length or a ribbon, a vector, such as a size of a frame for a print (width (in inches)) or a height (in inches)), or the size of a box for the European countries, such as a size of a box for the EU (width (in millimeters), height (in millimeters), depth (in millimeters)).

The values may also reference a known file type, such as an image for the design on a t-shirt, such as an embroidery file for the back of a jacket, such as an engraving design for a bracelet, and the like.

In some embodiments, values in key-value pairs may include a set of graphic primitives for a design, such as an image, a line, a circle, a rectangle, a text, a group, and the like.

The product option key-values may have default values. Default values are pre-set values that will produce a product without changing any key-value pairs through customization. When key-values are changed they may produce a product option framework event chain. A product option framework event chain is a journal of each key-value change ordered in time.

A product type may itself be represented by a product option key-value. Using this option type, one product type may be associated with another product type through a well-known relationship. The product option framework event chain may include one or more products, and the chain may represent or memorialize an event. The products may represent or memorialize an event. Examples of events may include invitations, save the date cards, birthday cards, birthday gifts, anniversary cards, birth announcements, RSVP cards, holiday cards, holiday gifts, thank-you cards, get-well cards, and the like.

The ProductOption key-value pairs may be used to automatically present an interface to a user. The ProductOption key-values pairs may be set, or changed, based on actions, or input, provided by a user.

In some embodiments, a calibrated product rendering asset is rendered as an image of the custom manufactured product by applying key-value pairs. The key-value pairs may set at least one of: a color or a color map of the rendering asset, a texture or the textural surface of the rendering asset, an image representing an ornamentation or pattern on the product, or the size relationships of the geometry of the rendering asset.

The high quality rendering method presented herein utilizes a scan-converting geometry at pixel resolution. Furthermore, the sub-pixel coverage is evaluated using the edge evaluation performed by a dot product scalar instruction. Moreover, the sub-pixel coverage is evaluated using binary arrays of at least 16×16 using scalar instructions.

8.0 Example Rendering Flow

Figure 4:
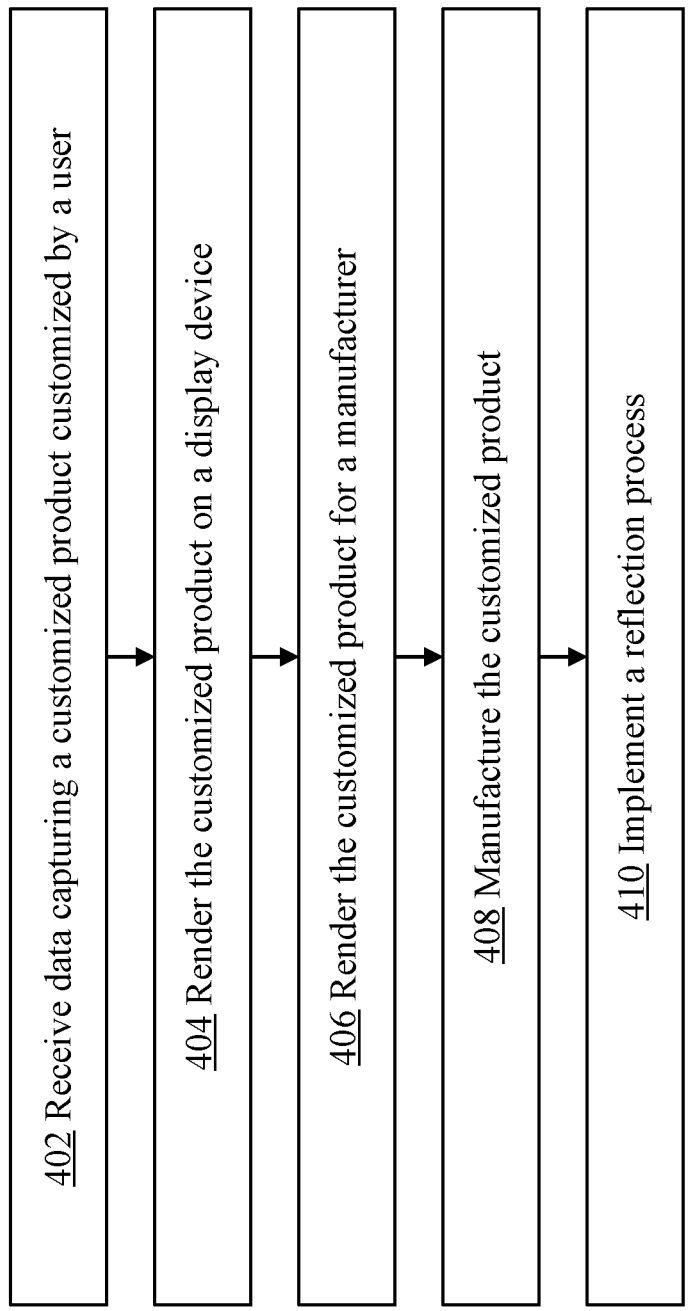
FIG. 4 illustrates an example processing flow for rendering synthetic images, according to some embodiments.

FIG. 4 illustrates an example processing flow for rendering synthetic images, according to some embodiments. The process allows manufacturing the user designed products and includes applying the user created colors and designs to the products made out of, for example, flat pattern pieces of fabric and sewn together. The steps described in FIG. 4 may be performed by a product customization system implemented in, for example, product synthetic view rendering platform 101 described in FIG. 1.

In step 402, a product customization system receives data capturing a customized product. The product customization system may, for example, provide a user interface allowing a user to customize the product. Then the product customization platform may receive the data capturing the customized product via the user interface. The interface may be implemented as one or more web pages. The user interface allows the user to interactively apply colors, tiled images, and photographic or designed images to two-dimensional pattern pieces that comprise the product. The data generated by the user interface may include user account data, a product description (that describes the user's custom product), user image designs (that contains the user content), color choices (the color(s) chosen by the user), material choices (the type of material for the custom product) and the finishing choices (the finishing selected by the user for the custom product). The user interface may be configured to assemble a set of instructions that describe the user design and to request the images of the final product from the user product renderer.

In step 404, the product customization system renders the customized product for the user using a user product renderer implementing the high quality rendering approach presented herein. The user product renderer may receive the data/information/description of the two dimensional pattern pieces (based on the user interactions with the user interface portion) and other user preferences and using information supplied by, for example, a reflection module. The reflection module may be configured to generate calibrated color maps and calibrated luminance maps to the calibrated product render assets (including geometry, luminance maps, color maps and safe area coverage maps) that are used to generate the images for the product. Then the renderer may synthesize an image of the final cut and stitch manufactured product that is then displayed to the user/consumer.

In step 406, the product customization system renders the customized product for a manufacturer using the manufacturing product renderer implementing the high quality rendering approach presented herein. The manufacturing product renderer may receive the data/information/description of the two dimensional pattern pieces, other user preferences and information supplied by the reflection module and prepare the image pattern files, cutting files, and operator directions used by a manufacturing module.

In step 408, the product customization system sends the customized product to a manufacturer, which uses the manufacturing equipment to manufacture the customized product. The manufacturing may include, for example, the following processes: 1) manufacture the flat pattern pieces using the image pattern files and cutting files; 2) sew the pattern pieces based on the operator directions; 3) perform finishing steps; 4) ship the product based on the operator directions; and/or 5) gather product information for the reflection portion (including patterns, reference product with calibration markup and/or color and material samples) that are input to a model-shot processing component that may perform, for example, various model-shot processing tasks.

In step 410, the product customization system performs the reflection process using the reflection module. The reflection module may be a portion of the system that provides feedback to the other portions of the systems. The reflection module may perform, for example, the following tasks: 1) provide updated product patterns to the manufacturing product renderer portion (the calibrated patterns and visible area layouts); 2) manufacture reference product used by the user product renderer portion (the calibrated patterns and visible area layouts); 3) calibrate pattern position with the manufacturer's reference product; 4) provide calibrated photographic references of reference product to the user product renderer portion; and/or 5) provide calibrated reflectance and color mapping for the user product renderer portion (the calibrated color maps and calibrated luminance maps).

9.0 Manufacturing

A manufacturing process may pertain to manufacturing a digital product as well as manufacturing a physical product. Since the manufacturing instructions for generating a product are generated based on a plurality of key-value pairs for a digital design of the product, in some situations, the same manufacturing instructions may be used to manufacture the digital product as well as to manufacture the physical product.

In some embodiments, a product options framework builds an interface for key-value pairs called OutputStyle. The interface for the OutputStyle key may allow a designer (or any other collaborator) to select values for the media for the presentation of an interactive design. The choices may include a JPEG_Image, a GIFF_Image, and an H264_Video.

If a designer chooses the GIFF_Image option, then the product options framework may send the instructions to the manufacturing system to traverse each of the key-values in the KeyValueJournal, and for each key, and use a User Product Renderer to render the state of the custom physical product with that modification as images in the sRGB 32-bit RGBA format. Subsequently, the manufacturing system may store the renderings in a local image cache.

Then, the manufacturing system may traverse the images stored in the local image cache and determine an optimal color palette for that collection of images.

Subsequently, the manufacturing system may convert the images in the local image cache from 32-bit RGBA format to 8 bit Indexed color.

Then, the manufacturing system may embed a digital watermark which encodes the input KeyValueJournal's UUID in the 8 bit indexed color image cache.

Next, the manufacturing system may begin encoding the image file. For example, the manufacturing system may write the header bytes; write the Logical Screen Descriptor bytes; write the found color palette as a gif Global Color Table; write the gif 8 bit character application name; and embed metadata as a comment (or a watermark) which encodes the input KeyValueJournal's UUID.

Once the manufacturing system processes all frames, the manufacturing system writes the file terminator (such as an ASCII code for zero) to the image file and outputs the manufactured GIF product.

At this point, executing the manufacturing instructions for the purpose of manufacturing the product ends, and the manufacturing of the product is completed.

10.0 Implementation Mechanism—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 5:
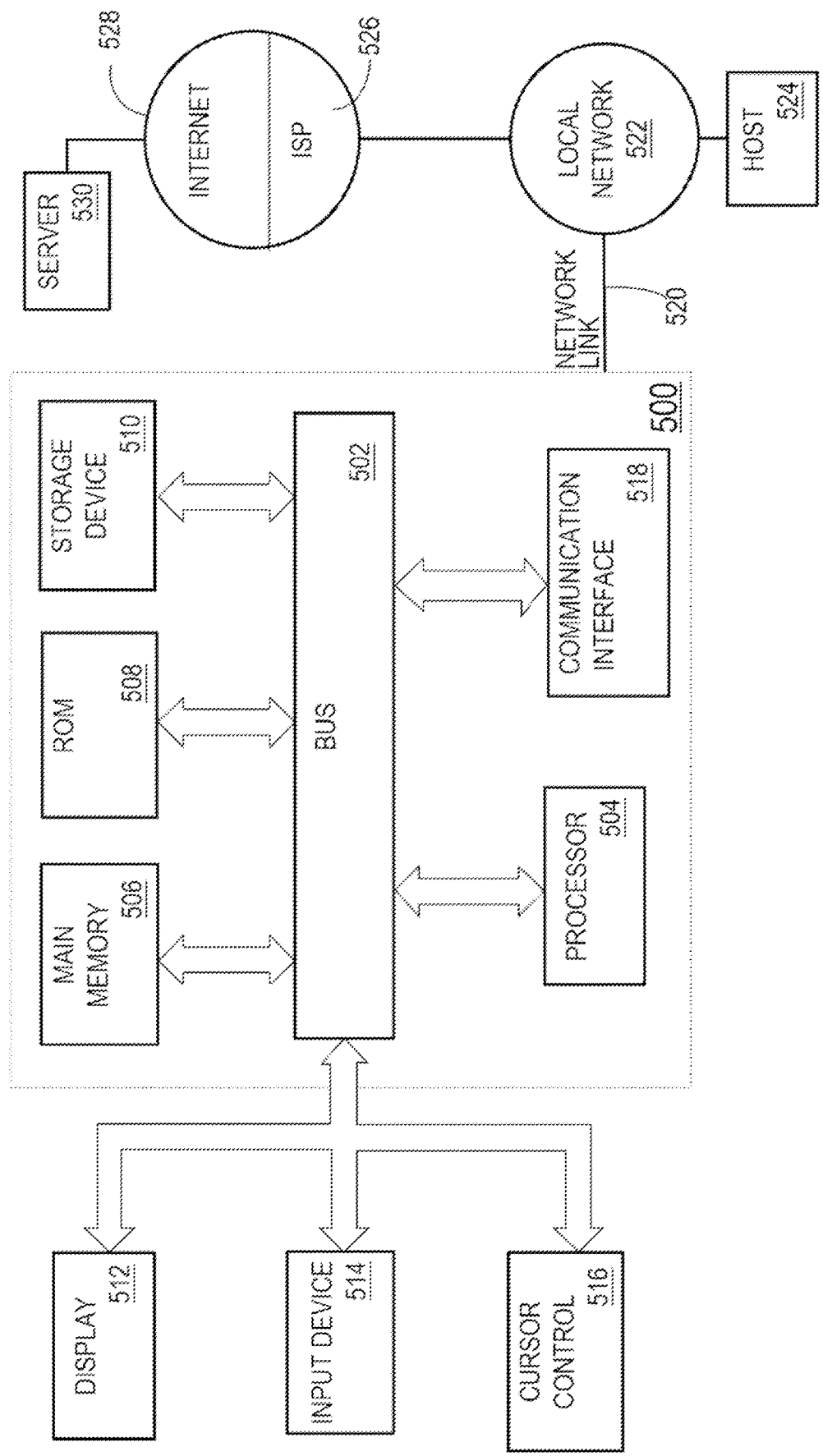
FIG. 5 is a block diagram that illustrates a computer system with which the techniques herein may be implemented.

For example, FIG. 5 is a block diagram that illustrates a computer system 500. Computer system 500 includes a bus 502 or other communication mechanism for communicating information, and a hardware processor 504 coupled with bus 502 for processing information. Hardware processor 504 may be, for example, a general purpose microprocessor.

Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory storage media accessible to processor 504, render computer system 500 into a special-purpose machine that is customized to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. The input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 510. Volatile media includes dynamic memory, such as main memory 506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the worldwide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution.

11.0 Extensions and Alternatives

In the foregoing specification, embodiments of the invention have been described with reference to numerous specific details that may vary from implementation to implementation. Thus, the sole and exclusive indicator of what is the invention and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A data processing method for generating a synthetic view rendering, the method comprising:
   generating a calibrated product renderings asset of a referenced physical product by:
   based on user input received for a digital asset corresponding to the referenced physical product, generating user-driven settings for a plurality of product option parametric key-values,
   applying the plurality of product option parametric key-values to the digital asset to generate the calibrated product renderings asset;
   rendering the calibrated product renderings asset using a coverage buffer and a coverage map to generate a final image; wherein the coverage map provides an evaluation of an ImplicitTriangle based on corresponding triangle points;
wherein the coverage buffer is a 2D array of 32 bit integers that are a start of an indexed list of CoverPix structures;
causing displaying the final image on a display device.

2. The data processing method of claim 1, wherein generating the final image comprises:
    initializing the coverage buffer;
    for each surface of the calibrated product renderings asset:
        biding one or more surface appearance assets to the surface to generate a converted surface;
        scanning the converted surface to generate a plurality of pixel samples and storing the plurality of pixels samples in the coverage buffer;
        evaluating the plurality of pixel samples to generate and update the coverage map;
    converting the coverage map to the final image.

3. The data processing method of claim 1, wherein the coverage map provides a map for a 16×16 sub pixel area.

4. The data processing method of claim 1, wherein the calibrated product renderings asset is generated by creating a digital representation of the referenced physical product;
    wherein the referenced physical product is generated using designated colors and patterns;
    wherein the designated colors and patterns include markups;
    wherein a markup is used to construct geometry, design areas, masks, local surface shadings, and global luminance shadings in the digital representation of the referenced physical product;
    wherein the geometry, and the global luminance shadings are captured using a plurality of product option parametric key-values.

5. The data processing method of claim 1, wherein applying the plurality of product option parametric key-values to the digital asset comprises:
    setting a substrate, trim, and key-values to the plurality of product option parametric key-values associated with color or textural appearance of the referenced physical product;
    wherein a substrate corresponds to a material from which the referenced physical product is made;
    wherein the color and textual appearance are set by references;
    wherein the trim is defined by trim geometry features and trim placements;
    wherein the trim geometry features and the trim placements are transformed by fitting a framing or an edging to the trim geometry features and setting physical profiles of the framing or the edging.

6. The data processing method of claim 1, wherein applying the plurality of product option parametric key-values to the digital asset comprises: generating a plurality of design areas associated with the calibrated product renderings asset, rendering an image in a design area, of the plurality of design areas, using a design U-V geometry specified by a markup.

7. The data processing method of claim 1, wherein applying the plurality of product option parametric key-values to the digital asset comprises:
    setting the plurality of product option parametric key-values by transforming geometry features and placements associated with the calibrated product renderings asset;
    wherein keys of the plurality of product option parametric key-values include one or more of: a product height, a product width, a product depth, a product circumference, a placement of designs, a design height, or a design width;
    wherein setting the plurality of product option parametric key-values comprises setting geometry transforms to a specific view and setting in-situ transforms;
    wherein for each polygon in the calibrated product renderings asset, a hybrid scanline and an implicit structure are built;
    wherein building the implicit structure comprises determining triangle points, triangle deltas, and implicit triangles for the calibrated product renderings asset.

8. A raster cover computer system, comprising:
    a memory unit;
    one or more processors; and
    a raster cover computer performing:
        generating a calibrated product renderings asset of a referenced physical product by:
            based on user input received for a digital asset corresponding to the referenced physical product, generating user-driven settings for a plurality of product option parametric key-values,
            applying the plurality of product option parametric key-values to the digital asset to generate the calibrated product renderings asset;
        rendering the calibrated product renderings asset using a coverage buffer and a coverage map to generate a final image; wherein the coverage map provides an evaluation of an ImplicitTriangle based on corresponding triangle points;
        wherein the coverage buffer is a 2D array of 32 bit integers that are a start of an indexed list of CoverPix structures;
        causing displaying the final image on a display device.

9. The raster cover computer system of claim 8, wherein generating the final image comprises:
    initializing the coverage buffer;
    for each surface of the calibrated product renderings asset:
        biding one or more surface appearance assets to the surface to generate a converted surface;
        scanning the converted surface to generate a plurality of pixel samples and storing the plurality of pixels samples in the coverage buffer;
        evaluating the plurality of pixel samples to generate and update the coverage map;
    converting the coverage map to the final image.

10. The raster cover computer system of claim 8, wherein the coverage map provides a map for a 16×16 sub pixel area.

11. The raster cover computer system of claim 8, wherein the calibrated product renderings asset is generated by creating a digital representation of the referenced physical product;
    wherein the referenced physical product is generated using designated colors and patterns;
    wherein the designated colors and patterns include markups;
    wherein a markup is used to construct geometry, design areas, masks, local surface shadings, and global luminance shadings in the digital representation of the referenced physical product;
    wherein the geometry, and the global luminance shadings are captured using a plurality of product option parametric key-values.

12. The raster cover computer system of claim 8, wherein applying the plurality of product option parametric key-values to the digital asset comprises:
 setting a substrate, trim, and key-values to the plurality of product option parametric key-values associated with color or textural appearance of the referenced physical product;
 wherein a substrate corresponds to a material from which the referenced physical product is made;
 wherein the color and textual appearance are set by references;
 wherein the trim is defined by trim geometry features and trim placements;
 wherein the trim geometry features and the trim placements are transformed by fitting a framing or an edging to the trim geometry features and setting physical profiles of the framing or the edging.

13. The raster cover computer system of claim 8, wherein applying the plurality of product option parametric key-values to the digital asset comprises: generating a plurality of design areas associated with the calibrated product renderings asset, rendering an image in a design area, of the plurality of design areas, using a design U-V geometry specified by a markup.

14. The raster cover computer system of claim 8, wherein applying the plurality of product option parametric key-values to the digital asset comprises:
 setting the plurality of product option parametric key-values by transforming geometry features and placements associated with the calibrated product renderings asset;
 wherein keys of the plurality of product option parametric key-values include one or more of: a product height, a product width, a product depth, a product circumference, a placement of designs, a design height, or a design width;
 wherein setting the plurality of product option parametric key-values comprises setting geometry transforms to a specific view and setting in-situ transforms;
 wherein for each polygon in the calibrated product renderings asset, a hybrid scanline and an implicit structure are built;
 wherein building the implicit structure comprises determining triangle points, triangle deltas, and implicit triangles for the calibrated product renderings asset.

15. One or more computer-readable non-transitory data storage media storing one or more sequences of instructions which, when executed by one or more computer processors, cause the one or more processors to perform:
 generating a calibrated product renderings asset of a referenced physical product by:
  based on user input received for a digital asset corresponding to the referenced physical product, generating user-driven settings for a plurality of product option parametric key-values,
  applying the plurality of product option parametric key-values to the digital asset to generate the calibrated product renderings asset;
 rendering the calibrated product renderings asset using a coverage buffer and a coverage map to generate a final image; wherein the coverage map provides an evaluation of an ImplicitTriangle based on corresponding triangle points;
 wherein the coverage buffer is a 2D array of 32 bit integers that are a start of an indexed list of CoverPix structures;
 causing displaying the final image on a display device.

16. The one or more computer-readable non-transitory data storage media of claim 15, wherein generating the final image comprises:
 initializing the coverage buffer;
 for each surface of the calibrated product renderings asset:
  biding one or more surface appearance assets to the surface to generate a converted surface;
  scanning the converted surface to generate a plurality of pixel samples and storing the plurality of pixels samples in the coverage buffer;
  evaluating the plurality of pixel samples to generate and update the coverage map;
 converting the coverage map to the final image.

17. The one or more computer-readable non-transitory data storage media of claim 15, wherein the coverage map provides a map for a 16×16 sub pixel area.

18. The one or more computer-readable non-transitory data storage media of claim 15, wherein the calibrated product renderings asset is generated by creating a digital representation of the referenced physical product;
 wherein the referenced physical product is generated using designated colors and patterns;
 wherein the designated colors and patterns include markups;
 wherein a markup is used to construct geometry, design areas, masks, local surface shadings, and global luminance shadings in the digital representation of the referenced physical product;
 wherein the geometry, and the global luminance shadings are captured using a plurality of product option parametric key-values.

19. The one or more computer-readable non-transitory data storage media of claim 15, wherein applying the plurality of product option parametric key-values to the digital asset comprises:
 setting a substrate, trim, and key-values to the plurality of product option parametric key-values associated with color or textural appearance of the referenced physical product;
 wherein a substrate corresponds to a material from which the referenced physical product is made;
 wherein the color and textual appearance are set by references;
 wherein the trim is defined by trim geometry features and trim placements;
 wherein the trim geometry features and the trim placements are transformed by fitting a framing or an edging to the trim geometry features and setting physical profiles of the framing or the edging.

20. The one or more computer-readable non-transitory data storage media of claim 15, wherein applying the plurality of product option parametric key-values to the digital asset comprises: generating a plurality of design areas associated with the calibrated product renderings asset, rendering an image in a design area, of the plurality of design areas, using a design U-V geometry specified by a markup.

* * * * *